(12) United States Patent
Ham

(10) Patent No.: US 6,319,636 B1
(45) Date of Patent: Nov. 20, 2001

(54) CELL PROJECTION MASK

(75) Inventor: Young Mog Ham, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/471,972

(22) Filed: Dec. 23, 1999

(30) Foreign Application Priority Data

Dec. 28, 1998 (KR) .................................. 98-59170

(51) Int. Cl.[7] .................. G03F 9/00; G03C 5/00; G21K 5/00
(52) U.S. Cl. ................... 430/5; 378/35; 430/296
(58) Field of Search .............. 430/5, 296, 322; 378/34, 35

(56) References Cited

U.S. PATENT DOCUMENTS

| | | | |
|---|---|---|---|
| 4,661,203 | 4/1987 | Smith et al. | 156/643 |
| 5,082,695 | * 1/1992 | Yamada et al. | 430/5 |
| 5,188,706 | * 2/1993 | Hori et al. | 430/5 |
| 5,523,185 | 6/1996 | Goto | 430/5 |
| 5,569,569 | 10/1996 | Goto et al. | 430/5 |
| 5,831,272 | 11/1998 | Utsumi | 250/492.2 |
| 5,858,576 | 1/1999 | Takashi et al. | 430/5 |
| 6,066,418 | 5/2000 | Yoshihara | 430/5 |

FOREIGN PATENT DOCUMENTS

| | | |
|---|---|---|
| 4188645 | 7/1992 | (JP) . |
| 7209856 | 8/1995 | (JP) . |
| 897122 | 4/1996 | (JP) . |
| 8162389 | 6/1996 | (JP) . |
| 8250403 | 9/1996 | (JP) . |
| 8335544 | 12/1996 | (JP) . |
| 9283411 | 10/1997 | (JP) . |
| 1070067 | 3/1998 | (JP) . |
| 10144249 | 5/1998 | (JP) . |

\* cited by examiner

*Primary Examiner*—S. Rosasco
(74) *Attorney, Agent, or Firm*—Selitto, Behr & Kim

(57) ABSTRACT

A cell projection mask, comprising: a frame for supporting means; a membrane formed over the frame, for making a stress due to electron beam to maintain balance; and an absorber formed over the membrane, for absorbing or reflecting the electron beam, wherein the absorber is comprised of a silicon layer and includes at least one or more ion implanting layers.

7 Claims, 2 Drawing Sheets

CELL PROJECTION MASK

BACKGROUND OF THE INVENTION

This invention relates to a lithography process using a non-optical exposure apparatus, and more particularly a cell projection mask used for an exposure mask in the lithography process using a non-optical exposure apparatus.

Non-optical exposure apparatus using electron beam, ion beam or X-ray or the like as a light source has a superior resolution to the conventional optical exposure apparatus using G-line or I-line as a light source. According to this, the lithography process using the non-optical exposure apparatus, for example the electron beam lithography process using electron beam as a light source makes it possible to form fine patterns of below critical dimension which are not obtained by the prior lithography using the conventional optical exposure apparatus. The electron beam lithography process is typically utilized in fabricating a mask for exposure as well as in fabricating non-memory devices such as a logic device or an ASICs.

Recently, the lithography process using a cell projection mask as a mask for exposure is developed. It has advantage in productivity and it is applicable to fabricate memory devices. Because the cell projection mask is applicable to all non-optical exposure apparatus using electron beam as well as X-ray or ion beam as a light source, a study on the cell projection mask has been variously accomplished.

FIG. 1 is a sectional view of a cell projection mask in the prior art. A cell projection mask 10 includes a frame 1 for supporting means, a membrane 2 formed over the frame 1, for making a stress due to electron beam to maintain balance and an absorber 3 formed over the membrane 2, for absorbing or reflecting electron beam. The reference numeral 4 designates apertures for transmitting electron beam. So as to fabricate the cell projection mask 10, a silicon-on insulator (SOI) wafer where an oxide layer is sandwiched between silicon layers is used.

Herein, the silicon layer for the absorber 3 should be maintained at a thickness of 10–20 μm and the reason is as follows. FIG. 2 shows a sectional view illustrating electron scattering in a silicon layer in case where the silicon layer is used for the absorber 3. An electron beam is projected into the silicon layer 30, electrons of the electron beams collide with silicon atoms of the silicon layer 30 to generate secondary electrons and the secondary electrons are scattered. While electrons are continuously scattering, if the induced force is removed, then the electron scattering is stopped. The reference numeral 20a designates the scattering course of electrons.

The depth where electrons are scattering is called as a penetration depth, which is determined by an incident energy of the electron beam. In general, the penetration depth of the electrons is about 1 μm in case of the incident energy of 10 keV and about 4 μm in case of 25 keV and about 12 μm in case of 50 keV. Accordingly, in the lithography process requiring an incident energy of the electron beam at 50 keV, so as to prevent the electron beam from penetrating, the silicon layer for an absorber should have a thickness of about 12 μm. Accordingly, considering the resolution, it should maintain the silicon layer to be at a thickness of 10–12 μm.

When the thickness of the silicon layer is 10–12 μm, the silicon layer as an absorber prevents the electron beams from penetrating. However, it is difficult to etch the silicon layer having a thick thickness of 10–12 μm and it takes a long time to etch the silicon layer, so that it is undesirable in productivity. Considering the process aspect, although it should reduce the thickness of the silicon layer, the electron beams penetrating the silicon layer for an absorber are increased and the resolution is remarkably degraded. Furthermore, if the thickness of the silicon layer is thicker, the electron beam reflected in the sidewall of the absorber made of silicon layer scatters the electron beam passing through the aperture. As a result, owing to the mutual interference, the contrast of the electron beam becomes low, so that it is impossible to form the desired pattern.

SUMMARY OF THE INVENTION

It is an object of the present invention to provide a cell projection mask having a silicon layer for an absorber reduced in a thickness, being capable of improving the resolution.

There is provided to a cell projection mask, comprising: a frame for supporting means; a membrane formed over the frame, for making a stress due to electron beam to maintain balance; and an absorber formed over the membrane, for absorbing or reflecting the electron beam, wherein the absorber is comprised of a silicon layer and includes at least one or more ion implanting layers.

BRIEF DESCRIPTION OF DRAWINGS

The objects and features of the invention may be understood with reference to the following detailed description of an illustrative embodiment of the invention, taken together with the accompanying drawings in which.

DETAILED DESCRIPTION OF THE INVENTION

Figure 1:
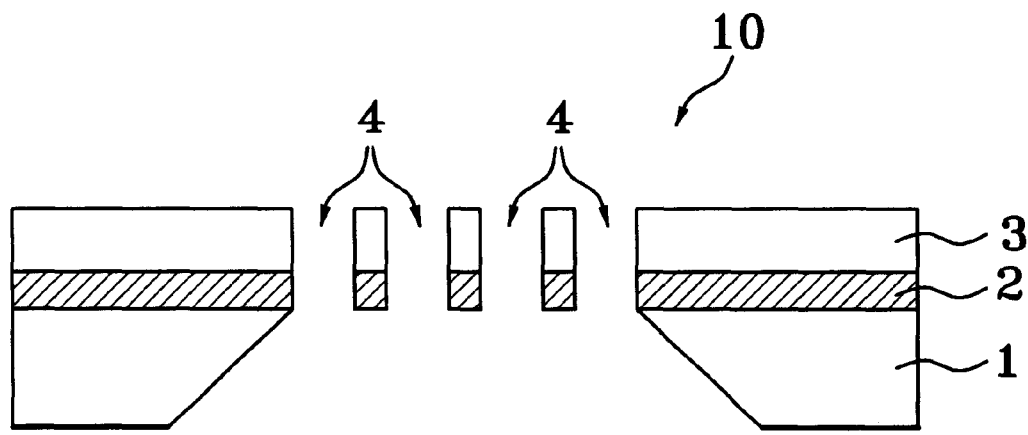
FIG. 1 is a sectional view of a cell projection mask in the prior art.
Figure 2:
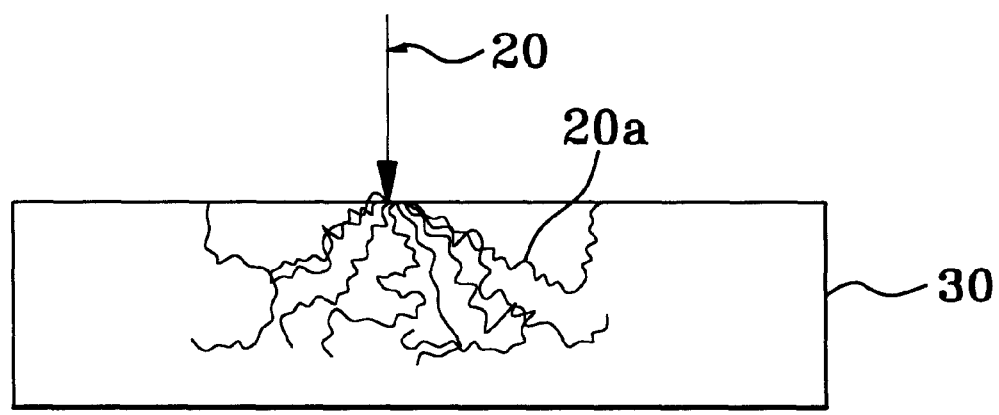
FIG. 2 is a diagram illustrating the electron scattering in a silicon layer in FIG. 1.
Figure 3:
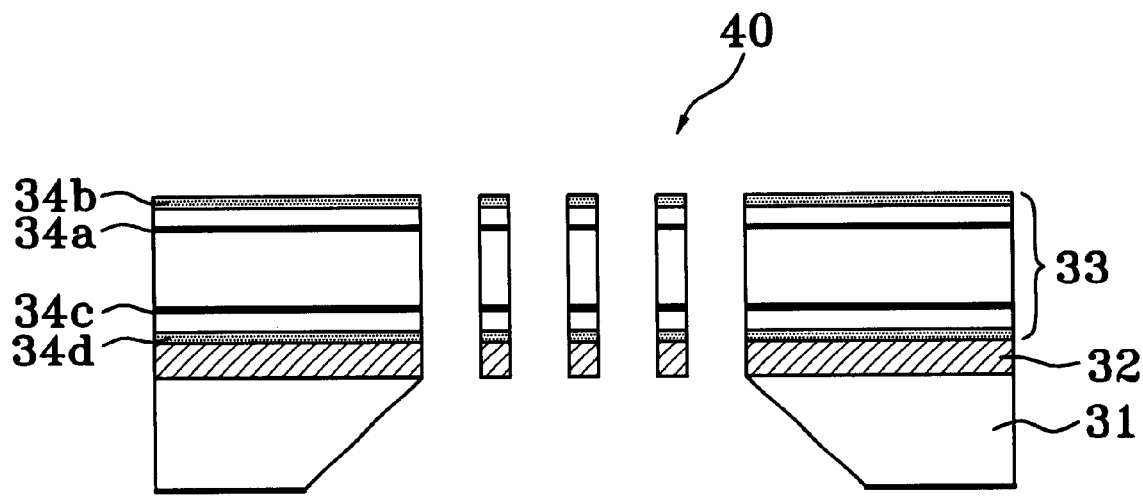
FIG. 3 is a sectional view of a cell projection mask in accordance with an embodiment of the present invention.

FIG. 3 shows a sectional view of a cell projection mask in accordance with an embodiment of the present invention. A cell projection mask 40 includes a frame 31 for supporting means, a membrane 32 formed over the frame 31, for making a stress due to electron beam to maintain balance and an absorber 33 formed over the membrane 32, for absorbing or reflecting the electron beam. The absorber 33 is comprised of a silicon layer and includes at least one or more ion implanting layers, for example two ion implanting layers 34a and 34b.

For example, if the absorber 33 includes one ion implanting layer, any ones of As ions, B ions or P ions are implanted into the silicon layer of the absorber 33 in a selected depth and then heat-treated to form the ion implanting layer. If the absorber includes two ion implanting layers 34a and 34b, any ions of Sn ions, Sb ions or Ag ions which have a mass larger than Au ions are implanted into the silicon layer 33 in a first depth and any ones of As ions, Se ions, Ge ions, P ions or B ions which have a mass smaller than the Au ions are implanted into the silicon layer 33 at a second depth which is shallower than the first depth. Then it carries out the heat-treatment to simultaneously form the first ion implanting layer 34a and the second ion implanting layer 34b. The first ion implanting layer 34a formed at a distance from an upper surface of the silicon layer 33 and the second ion implanting layer 34b is formed near the upper surface of the silicon layer 33.

On the other hand, the two ion implanting layers are also formed near the upper and lower surfaces of the absorber 33, respectively. For example, if the two ion implanting layers are formed near the upper and lower surfaces of the absorber 33 which is comprised of the silicon layer, any ones of As ions, B ions or P ions are first implanted near the lower surface of the silicon layer 33 and the ions are secondarily implanted near the upper surface of the silicon layer 33. Then, the heat-treat process is carried out to form the two ion implanting layers near the upper and lower surfaces of the absorber 33, respectively.

If two pairs of ion implanting layers 34a and 34b, 34c and 34d are formed near the upper and the lower surfaces of the absorber 33 respectively, so as to form the ion implanting layers 34a to 34d near the upper and lower surfaces of the absorber 33 by two layers, ions having different mass are implanted at different depths in turn and then heat-treated. Herein, the ion implanting layers 34c and 34d near the lower surface of the silicon layer 33 are formed by implanting ions from the lower surface of the cell projection mask 40.

At this time, two pair of ion implanting layers 34a and 34c, 34b and 34d are formed near the upper and lower surfaces of the absorber 33, respectively by implanting ions having different mass. However, two pairs of ion implanting layers 34a and 34c, 34b and 34d may be formed near the upper and lower surfaces of the absorber 33 by ions having the same mass with different energy. The ion implanting layers are formed in a silicon layer for an absorber before a SOI wafer for the cell projection mask is fabricated.

Figure 4:
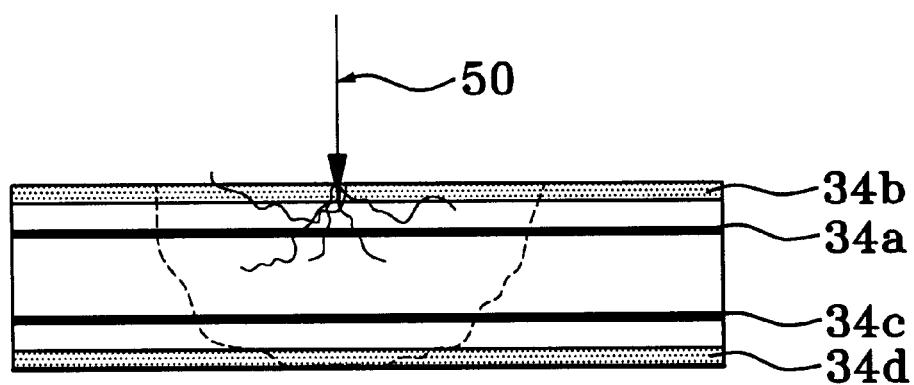
FIG. 4 is a diagram illustrating the electron scattering in a silicon layer for an absorber in FIG. 3.

FIG. 4 shows a sectional view illustrating the electron scattering in case where the ion implanting layer is formed near the upper and lower surfaces of the absorber by two layers. As shown in FIG. 4, when the ion implanting layers 34a to 34d are formed in the silicon layer 33, the scattering depth of electrons, that is the penetrating depth of electrons is reduced as compared with the prior art where the ion implanting layers are not formed in the silicon layer.

In other words, because the ion implanting layers 34a to 34d have different material characteristics from the silicon layer 33 for the absorber, they serve as barriers to the electron scattering. According to this, it is difficult for the electrons of the electron beam 50 projected into the absorber 33 to penetrate an interface between the silicon layer and the ion implanting layer. Therefore, the scattering length is shorten by the ion implanting layers 34a and 34b formed near the upper surface of the silicon layer 33 so that the electron scattering is restrained to reduce the electron penetrating depth. As a result, the thickness of the silicon layer for the absorber 33 can be reduced at 5 $\mu$m which is thinner than a thickness of 20 $\mu$m requiring the case where the incident energy of electron beams is 50 keV. Furthermore, because the electron beam scattering in the absorber 33 can be restrained by the ion implanting layers 34a to 34d, the electron beam scattering from the sidewall of the absorber 33 can be restrained. Therefore, the mutual interference of the electron beam penetrated through apertures and the electron beam penetrated through the absorber is removed so that the resolution of the cell projection mask 40 can be improved.

According to the present invention, the cell projection mask includes at least one or more ion implanting layers in the silicon layer for an absorber to reduce the electron penetration depth and then the thickness of the silicon layer can be decreased. Accordingly, it can solve the difficulty in the process due to the thick thickness of the absorber to fabricate the cell projection mask with ease. Furthermore, it can prevent the interference due to electron beam scattered through the absorber to improve the resolution.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A cell projection mask comprising:

a frame;

a membrane formed over the frame; and an absorber formed over the membrane, for absorbing or reflecting an electron beam, wherein the absorber is comprised of a silicon layer and includes at least one ion implanted layer in the silicon layer so as to form a barrier for inhibiting an electron beam from penetrating through the absorber such that the thickness of the absorber can be minimized.

2. The cell projection mask as claimed in claim 1, wherein said at least one ion implanted layer includes a single ion implanted layer.

3. The cell projection mask as claimed in claim 2, wherein ions of said at least one ion implanted layer are comprised of any one of As, B or P.

4. The cell projection mask as claimed in claim 1, wherein said at least one ion implanted layer includes two ion implanted layers.

5. The cell projection mask as claimed in claim 4, wherein one of said two ion implanted layers is formed at a distance from an upper surface of the absorber, and the other one of said two ion implanted layers is formed near the upper surface of the absorber.

6. The cell projection mask as claimed in claim 5, wherein ions of said one of said two ion implanted layers are comprised of any one of Sn, Sb or Ag which has a mass larger than Au, and ions of said other one of said two ion implanted layers are comprised of As, Se, Ge, P or B which has a mass smaller than Au.

7. The cell projection mask as claimed in claim 1, wherein said at least one ion implanted layer includes a plurality of ion implanted layers formed near upper and lower surfaces of the absorber.

* * * * *